US012755774B2

(12) United States Patent
Ando et al.

(10) Patent No.: US 12,755,774 B2
(45) Date of Patent: Oct. 6, 2026

(54) SEMICONDUCTOR DEVICE HAVING ROW DECODER CIRCUIT

(71) Applicant: MICRON TECHNOLOGY, INC., Boise, ID (US)

(72) Inventors: Keiya Ando, Sagamihara (JP); Mamoru Nishizaki, Yokohama (JP); Kenji Asaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 176 days.

(21) Appl. No.: 18/749,446

(22) Filed: Jun. 20, 2024

(65) Prior Publication Data

US 2025/0029650 A1 Jan. 23, 2025

Related U.S. Application Data

(60) Provisional application No. 63/514,417, filed on Jul. 19, 2023.

(51) Int. Cl.

*G11C 16/08* (2006.01)
*G11C 11/4074* (2006.01)
*G11C 11/408* (2006.01)
*G11C 11/4091* (2006.01)

(52) U.S. Cl.

CPC ...... *G11C 11/4085* (2013.01); *G11C 11/4074* (2013.01); *G11C 11/4087* (2013.01); *G11C 11/4091* (2013.01)

(58) Field of Classification Search

CPC ............ G11C 11/4085; G11C 11/4074; G11C 11/4087; G11C 11/4091; G11C 16/08

See application file for complete search history.

(56) References Cited

U.S. PATENT DOCUMENTS 9,373,378 B1 * 6/2016 Chen ........................ G11C 8/08
2010/0085828 A1 * 4/2010 Parent ................. G11C 11/4085 365/230.06
2010/0142306 A1 * 6/2010 Nakamura ............... G11C 8/08 365/189.09
2012/0320699 A1 * 12/2012 Noguchi .................. G11C 8/08 365/226
2020/0349999 A1 * 11/2020 Kawamura ......... G11C 11/4076
2021/0225425 A1 * 7/2021 Do ...................... G11C 11/4085
2021/0327490 A1 * 10/2021 Park .................... G11C 11/5642
2023/0223069 A1 * 7/2023 Schreck .................. G11C 8/08 365/149

* cited by examiner

*Primary Examiner* — Mushfique Siddique
(74) *Attorney, Agent, or Firm* — Dorsey & Whitney LLP

(57) ABSTRACT

An example apparatus includes: a plurality of first regions each including second and third regions; a plurality of main word driver circuits each configured to activate an associated one of a plurality of main word lines responsive to a row address signal; and a voltage control circuit configured to supply a first power voltage to the plurality of main word driver circuits in a first operation mode and a second power voltage different from the first power voltage to the plurality of main word driver circuits in a second operation mode. One or ones of the plurality of main word driver circuits is arranged in the second region included in each of the plurality of first regions. The voltage control circuit is divided into multiple circuit portions arranged in two or more third regions in two or more of the plurality of first regions, respectively.

18 Claims, 12 Drawing Sheets

SEMICONDUCTOR DEVICE HAVING ROW DECODER CIRCUIT

CROSS REFERENCE TO RELATED APPLICATION(S)

This application claims the benefit under 35 U.S.C. § 119 of the earlier filing date of U.S. Provisional Application Ser. No. 63/514,417, filed Jul. 19, 2023, the entire contents of which are hereby incorporated by reference in its entirety for any purpose.

BACKGROUND

There is a case where a semiconductor memory device such as a DRAM (Dynamic Random Access Memory) is configured to select a word line based on a row address and to select a bit line based on a column address. There is a case where the word line is hierarchized in a main word line selected by a higher-order bit of the row address and a sub word line selected by a lower-order bit of the row address. In order to reduce GIDL (Gate-Induced Drain Leakage) of a transistor included in a sub word driver, at a standby time, there is a case where an operation voltage lower than that at normal times is supplied to a main word driver that drives the main word line.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
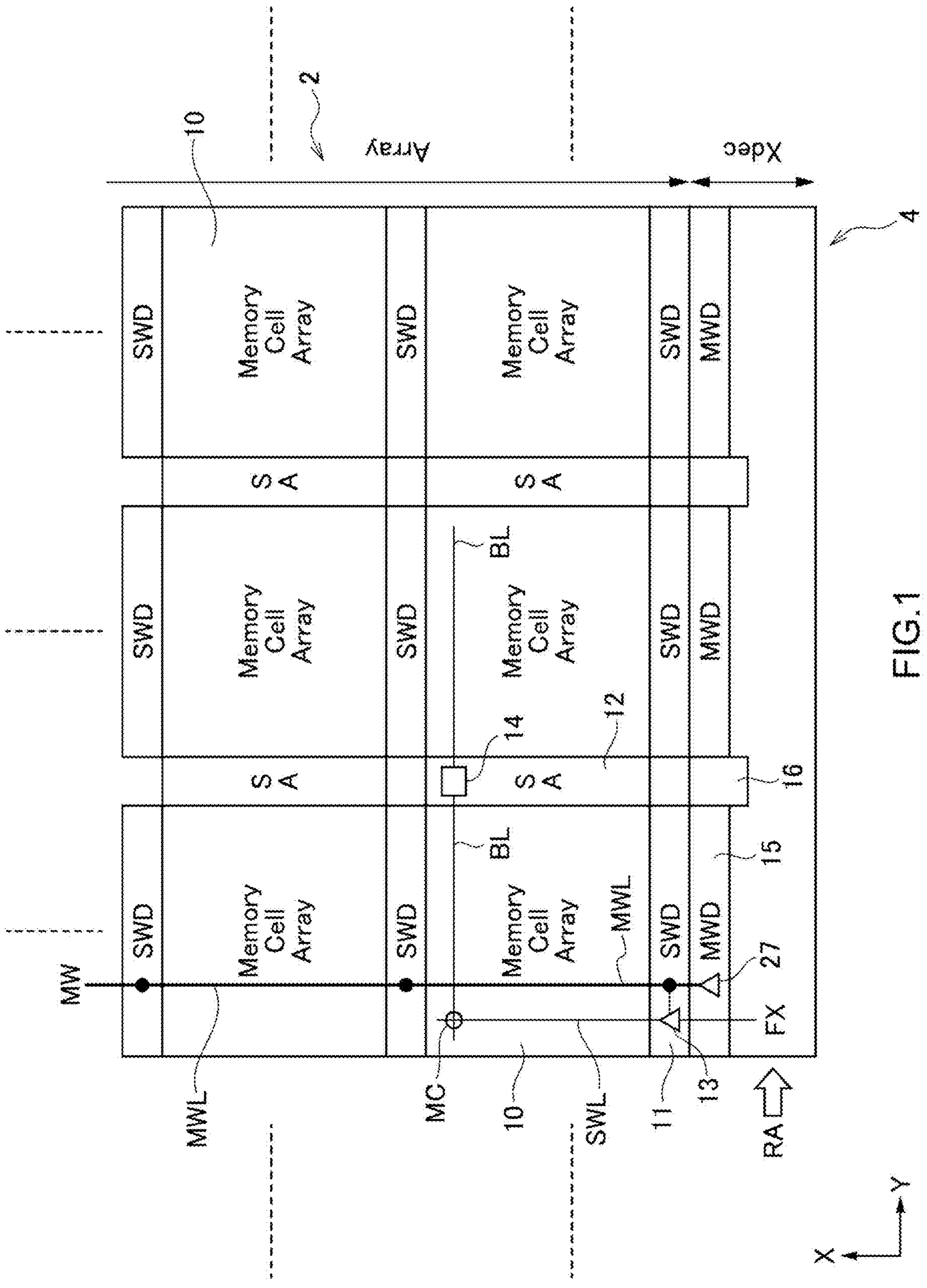
FIG. 1 is a schematic diagram showing a configuration of main parts of a semiconductor memory device according to an embodiment of the present disclosure.

FIG. 1 is a schematic diagram showing a configuration of main parts of a semiconductor memory device according to an embodiment of the present disclosure. The semiconductor memory device shown in FIG. 1 is a DRAM, and the semiconductor memory device includes an array region 2 including a plurality of memory cell arrays 10 and a row decoder region 4 arranged at an end of the array region 2 in an X direction. In the array region 2, a sub word driver region 11 is provided between memory cell arrays 10 adjacent to each other in the X direction, and a sense amplifier region 12 is provided between memory cell arrays 10 adjacent to each other in a Y direction. In some examples, the X direction and the Y direction are perpendicular to each other. A plurality of sub word drivers 13 are arranged in the sub word driver region 11. Each of the sub word drivers 13 activates an associated one of sub word lines SWL based on a sub word selection signal FX and a main word signal MW supplied via a main word line MWL. A plurality of sense amplifiers 14 are arranged in the sense amplifier region 12. Each of the sense amplifiers 14 amplifies a potential difference appearing on a pair of bit lines BL. A memory cell MC is arranged at an intersection of a sub word line SWL and a bit line BL. With this configuration, when a data held in the memory cell MC responsive to activation of the sub word line SWL is read by the bit line BL, the data read by the bit line BL is amplified by an associated one of the sense amplifiers 14.

A row address RA is supplied to the row decoder region 4. The sub word selection signal FX is generated based on a lower-order bit of the row address RA. The main word signal MW is generated based on a higher-order bit of the row address RA. A plurality of main word driver regions 15 are arranged in the row decoder region 4. A plurality of main word driver circuits 27 that drive the main word line MWL are arranged in each of the main word driver regions 15. Each of the main word driver regions 15 is allocated to a plurality of memory cell arrays 10 arrayed in the X direction. The width of each of the main word driver regions 15 in the Y direction is substantially the same as the width of each of the memory cell arrays 10 in the Y direction. A gap region 16 is arranged between the main word driver regions 15 adjacent to each other in the Y direction. The width of the gap region 16 in the Y direction is substantially the same as the width of the sense amplifier region 12 in the Y direction. The width of the gap region 16 in the X direction may be greater than the width of each of the main word driver regions 15 in the X direction.

Figure 2:
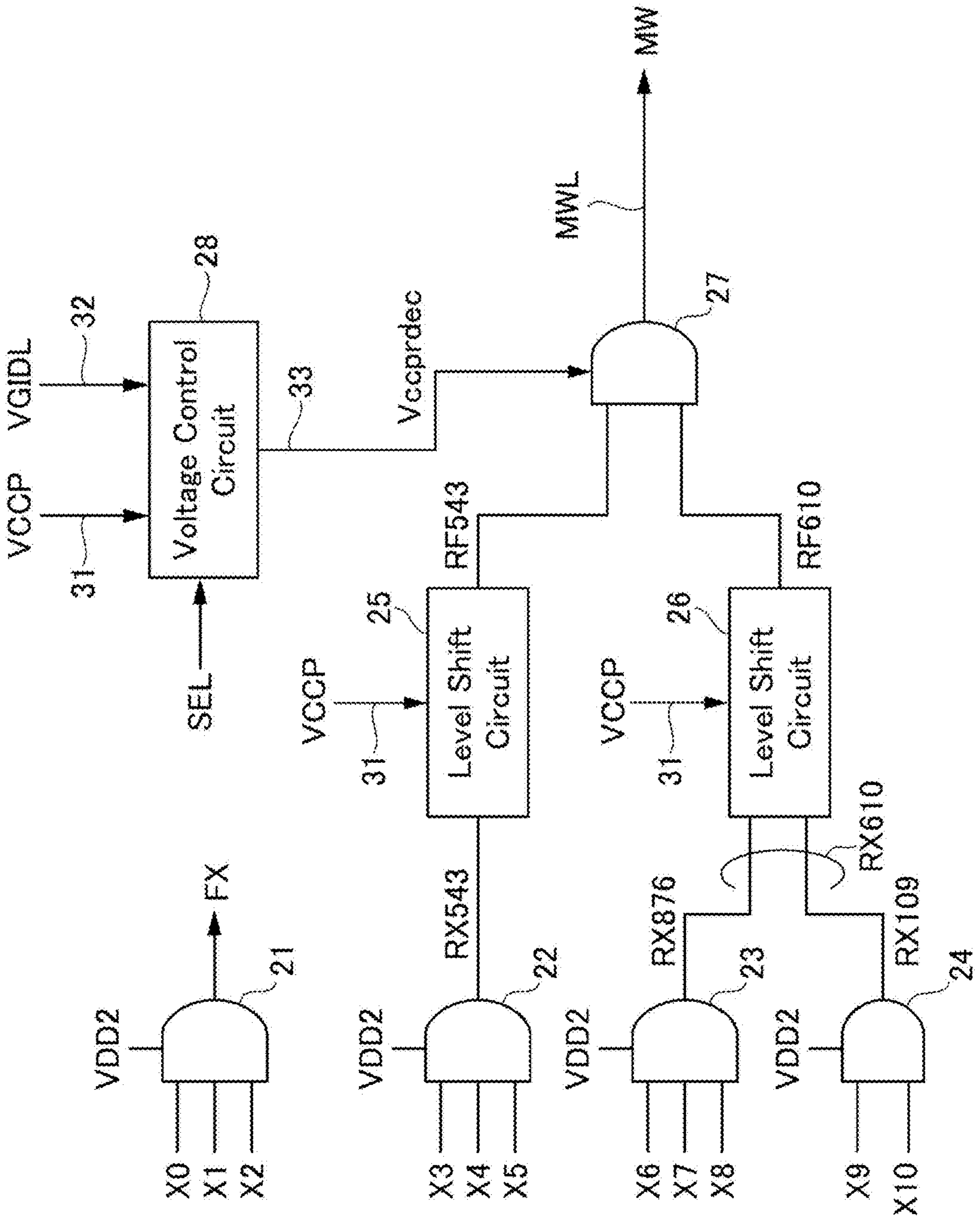
FIG. 2 is a schematic circuit diagram for explaining functions of circuits included in a main word driver region.

FIG. 2 is a schematic circuit diagram for explaining functions of circuits included in each of the main word driver regions 15. In the example shown in FIG. 2, address bits X0 to X2 constituting the row address RA are supplied to a pre-decoder 21. The pre-decoder 21 generates the sub word selection signal FX based on the address bits X0 to X2. Further, address bits X3 to X5 constituting the row address RA are supplied to a pre-decoder 22. The pre-decoder 22 generates a pre-decode signal RX543 based on the address bits X3 to X5. The pre-decode signal RX543 has, for example, an 8-bit configuration formed of pre-decode bits RX543<0> to RX543<7>, and the pre-decode signal RX543 activates any one of the pre-decode bits RX543<0> to RX543<7>. Address bits X6 to X8 constituting the row address RA are supplied to a pre-decoder 23. The pre-decoder 23 generates a pre-decode signal RX876 based on the address bits X6 to X8. The pre-decode signal RX876 has, for example, an 8-bit configuration formed of pre-decode bits RX876<0> to RX876<7>, and the pre-decode signal RX876 activates any one of the pre-decode bits RX876<0> to RX876<7>. Address bits X9 and X10 constituting the row address RA are supplied to a pre-decoder 24. The pre-decoder 24 generates a pre-decode signal RX109 based on the address bits X9 and X10. The pre-decode signal RX109 has, for example, a 4-bit configuration formed of pre-decode bits RX109<0> to RX109<3>, and the pre-decode signal RX109 activates any one of the pre-decode bits RX109<0> to RX109<3>. The pre-decode signal RX876 and the pre-decode signal RX109 constitute a pre-decode signal RX910. Note that it is not always necessary to decode each of the address bits X6 to X8 and the address bits X9 and X10 by the pre-decoders 23 and 24, respectively, and the pre-decode signal RX910 may be generated by a pre-decoder that decodes the address bits X6 to X10.

The pre-decode signal RX543 is converted to a pre-decode signal RF543 by a level shift circuit 25. A pre-decode signal RX610 constituting the pre-decode signals RX876 and RX109 is converted to a pre-decode signal RF610 by a level shift circuit 26. The pre-decode signals RF543 and RF610 are supplied to the main word driver circuit 27. The main word driver circuit 27 activates an associated main word line MWL based on the pre-decode signal RF543 and the pre-decode signal RF610. A power potential VCCP of each of the level shift circuits 25 and 26 is supplied via a power line 31. A power potential Vccprdec of the main word driver circuit 27 is supplied via a power line 33. The level of the power potential Vccprdec is selected by a voltage control circuit 28 based on a selection signal SEL. Power potentials VCCP and VGIDL are supplied via the power lines 31 and 32 respectively to the voltage control circuit 28, and any one of the power potential VCCP and the power potential VGIDL is supplied to the power line 33 based on the selection signal SEL. The power potential VCCP is selected at a normal operation. The power potential VGIDL is selected at a standby time. The level of the power potential VGIDL is lower than that of the power potential VCCP, and thus GIDL at a standby time is reduced. Further, a power potential VDD2 of each of the pre-decoders 21 to 24 is lower than the power potential VCCP and the power potential VGIDL. The level shift circuit 25 has a function to convert the pre-decode signal RX543 having an amplitude VDD2 to the pre-decode signal RF543 having an amplitude VCCP or VGIDL. The level shift circuit 26 has a function to convert the pre-decode signal RX610 having the amplitude VDD2 to the pre-decode signal RF610 having the amplitude VCCP or VGIDL.

Figure 3:
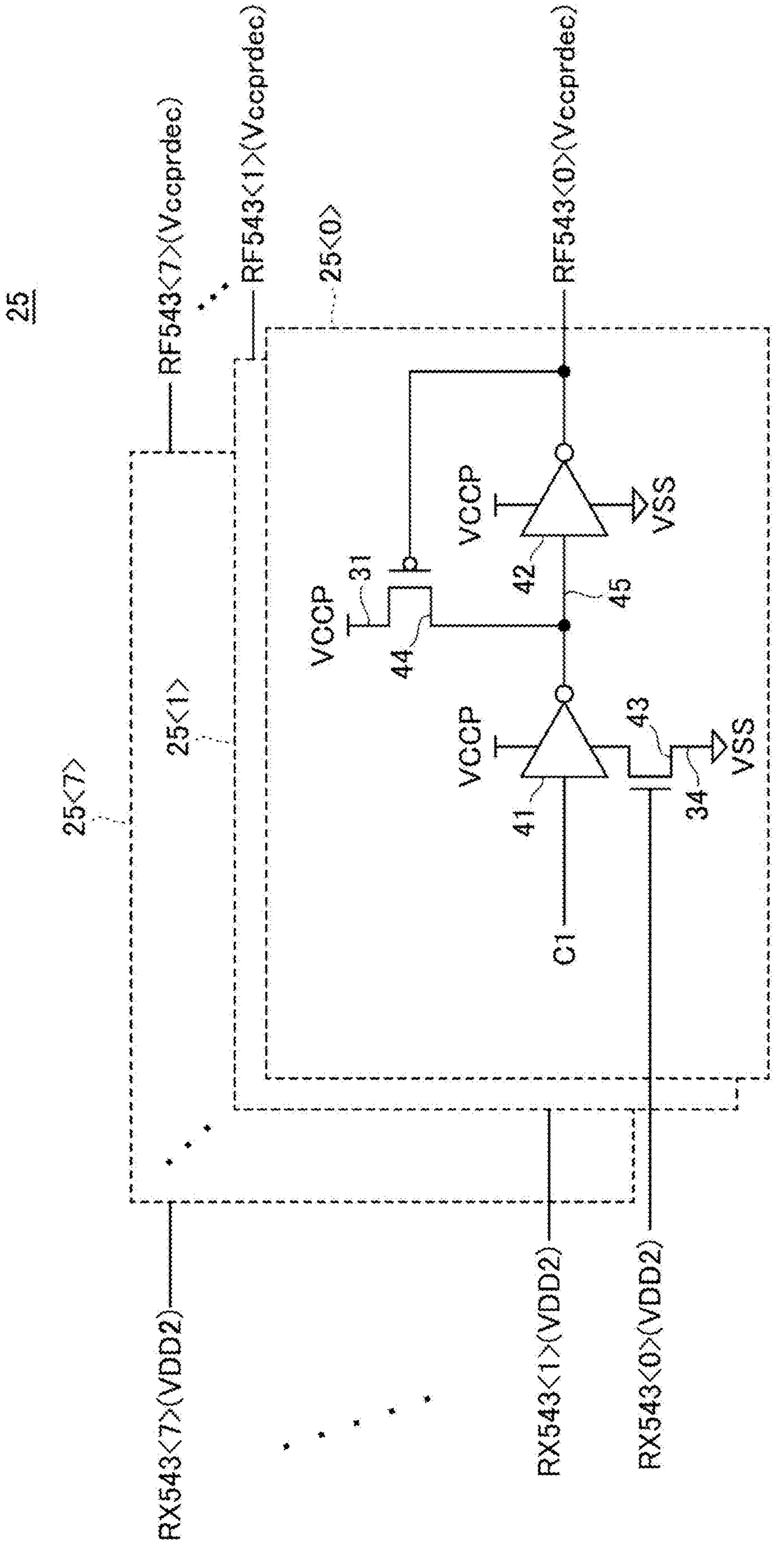
FIGS. 3 and 4 are circuit diagrams of a level shift circuit.

FIG. 3 is a circuit diagram of the level shift circuit 25. As shown in FIG. 3, the level shift circuit 25 is formed of eight level shift circuits 25<0> to 25<7> respectively associated with pre-decode bits RX543<0> to RX543<7>. The level shift circuit 25<0> includes cascade-coupled inverter circuits 41 and 42, an N-channel MOS transistor 43, and a P-channel MOS transistor 44. A control signal C1 is supplied to an input node of the inverter circuit 41. An output node of the inverter circuit 41 and an input node of the inverter circuit 42 are coupled to each other via a signal line 45. The power potential VCCP is supplied to a high-potential side power node of each of the inverter circuits 41 and 42. The transistor 43 is coupled between a low-potential side power node of the inverter circuit 41 and a power line 34 to which a ground potential VSS is supplied. The pre-decode bit RX543<0> is supplied to agate electrode of the transistor 43. With this configuration, the inverter circuit 41 included in the level shift circuit 25<0> is activated when the pre-decode bit RX543<0> is at a high level. The transistor 44 is coupled between the power line 31 to which the power potential VCCP is supplied and the signal line 45. A gate electrode of the transistor 44 is coupled to an output node of the inverter circuit 42. A level-shifted pre-decode bit RF543<0> is output from the output node of the inverter circuit 42. With this circuit configuration, in response to the control signal C1, the pre-decode bit RX543<0> having the amplitude VDD2 is converted to the pre-decode bit RF543<0> having the amplitude VCCP. As for other level shift circuits 25<1> to 25<7>, other than a fact that the pre-decode bits RX543<1> to RX543<7> respectively associated therewith are converted to the pre-decode bits RF543<1> to RF543<7>, each of these circuits has a circuit configuration same as that of the level shift circuit 25<0> shown in FIG. 3. These eight level shift circuits 25<0> to 25<7> are arranged in one main word driver region 15 shown in FIG. 1.

Figure 4:
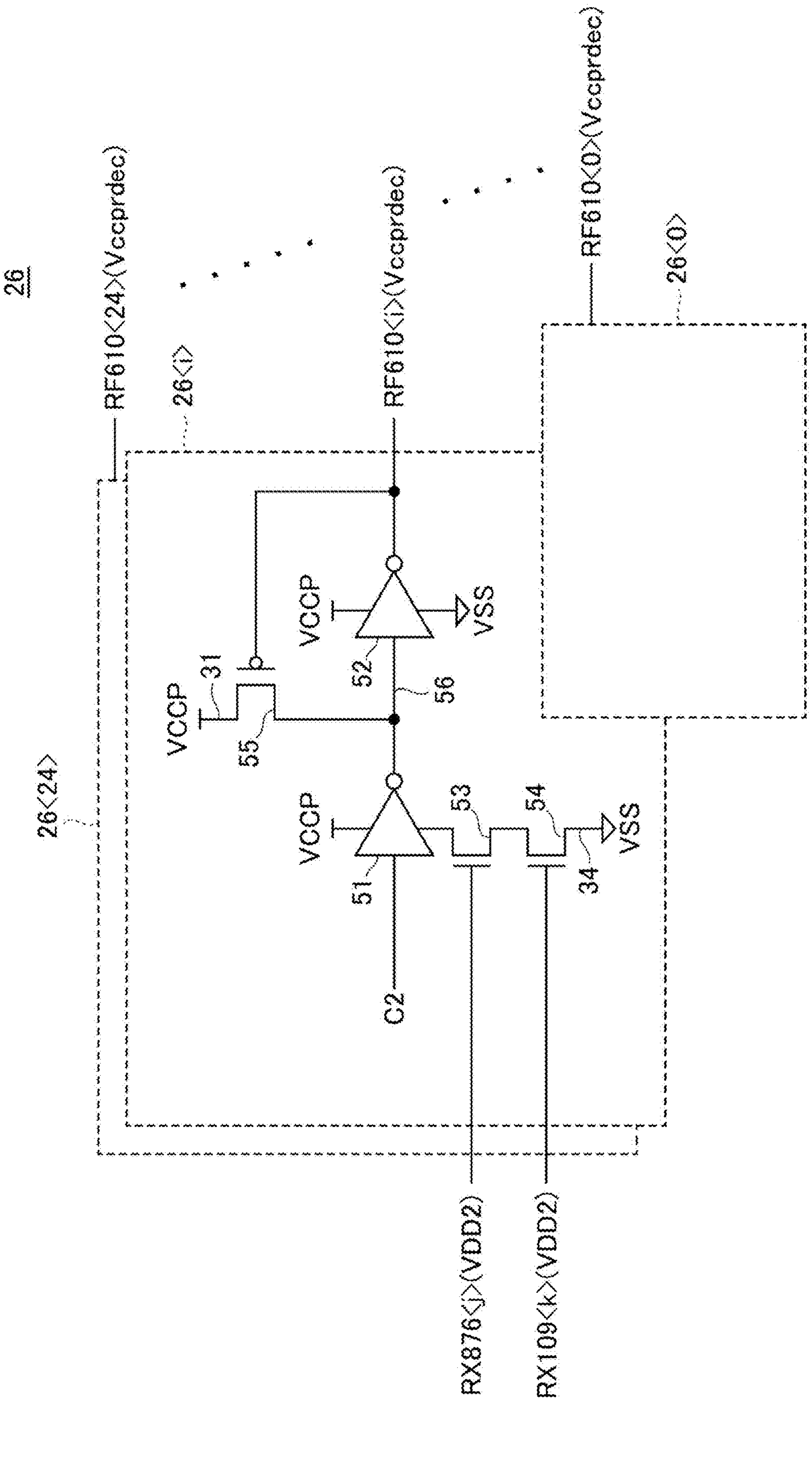

FIG. 4 is a circuit diagram of the level shift circuit 26. As shown in FIG. 4, the level shift circuit 26 is formed of 25 level shift circuits 26<0> to 26<24> to which any one of pre-decode bits RX876<0> to RX876<7> and any one of pre-decode bits RX109<0> to RX109<3> are input in respectively different pairs. FIG. 4 shows a circuit configuration of one level shift circuit 26<*i*>. The level shift circuit 26<*i*> includes cascade-coupled inverter circuits 51 and 52, N-channel MOS transistors 53 and 54, and a P-channel MOS transistor 55. A control signal C2 is supplied to an input node of the inverter circuit 51. An output node of the inverter circuit 51 and an input node of the inverter circuit 52 are coupled to each other via a signal line 56. The power potential VCCP is supplied to a high-potential side power node of each of the inverter circuits 51 and 52. The transistors 53 and 54 are coupled to each other in series between a low-potential side power node of the inverter circuit 51 and the power line 34 to which the ground potential VSS is supplied. An associated pre-decode bit RX543<*j*> (j is any one of 0 to 7) is supplied to a gate electrode of the transistor 53. An associated pre-decode bit RX109<*k*> (k is any one of 0 to 3) is supplied to a gate electrode of the transistor 54. With this configuration, the inverter circuit 51 included in the level shift circuit 26<*i*> is activated when both the associated pre-decode bit RX543<*j*> and an associated pre-decode bit RX109<*k*> are at a high level. The transistor 55 is coupled between the power line 31 to which the power potential VCCP is supplied and the signal line 56. A gate electrode of the transistor 55 is coupled to an output node of the inverter circuit 52. A pre-decode bit RF610<*i*> having the amplitude VCCP is output from the output node of the inverter circuit 52. With this circuit configuration, when both the associated pre-decode bit RX543<*j*> and the associated pre-decode bit RX109<*k*> are at a high level, in response to the control signal C2, the level shift circuit 26<*i*> activates the associated pre-decode bit RF610<*i*> to a VCCP level. In this manner, with a configuration in which the pre-decode bits RX876<0> to RX876<7> and the pre-decode bits RX109<0> to R109X<3> are input in respectively different pairs to the level shift circuits 26<0> to 26<24>, the level shift circuits 26<0> to 26<24> activate anyone of the pre-decode bits RF610<0> to RF610<24>. The 25 level shift circuits 26<0> to 26<24> are arranged in one main word driver region 15 shown in FIG. 1.

Figure 5:
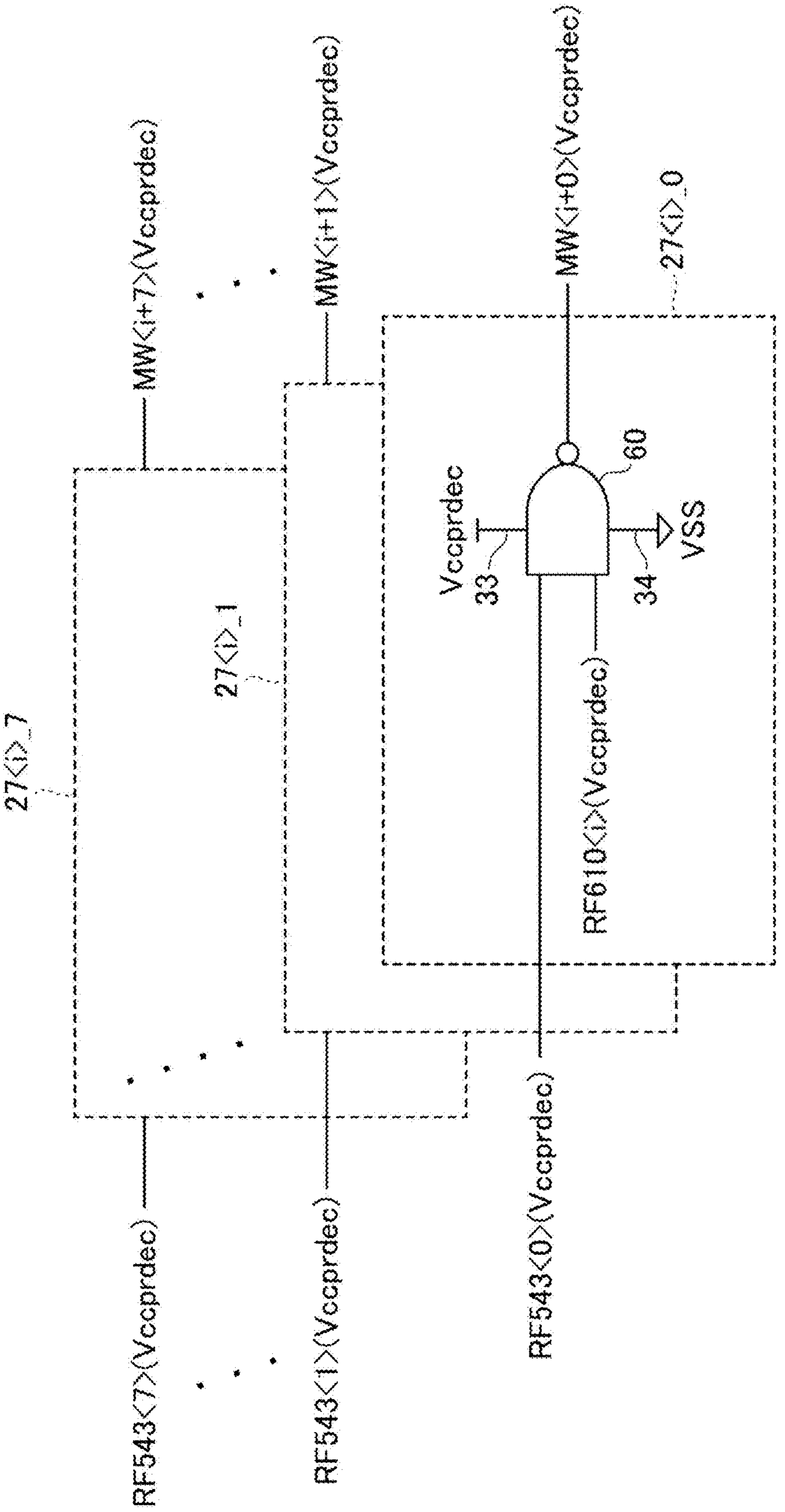
FIG. 5 is a circuit diagram of a main word driver circuit.

FIG. 5 is a circuit diagram of a main word driver circuit 27<*i*>. As shown in FIG. 5, the main word driver circuit 27<*i*> is formed of eight main word driver circuits 27<*i*>_0 to 27<*i*>_7 each of which receives the pre-decode bit RF610<*i*>. Each of the main word driver circuits 27<*i*>_0 to 27<*i*>_7 is constituted of the pre-decode bit RF610<*i*> and a NAND gate circuit 60 that receives one associated bit among the pre-decode bits RX543<0> to RX543<7>. The main word signal MW as an output from the NAND gate circuit 60 is supplied to each associated main word line MWL.

Figure 6:
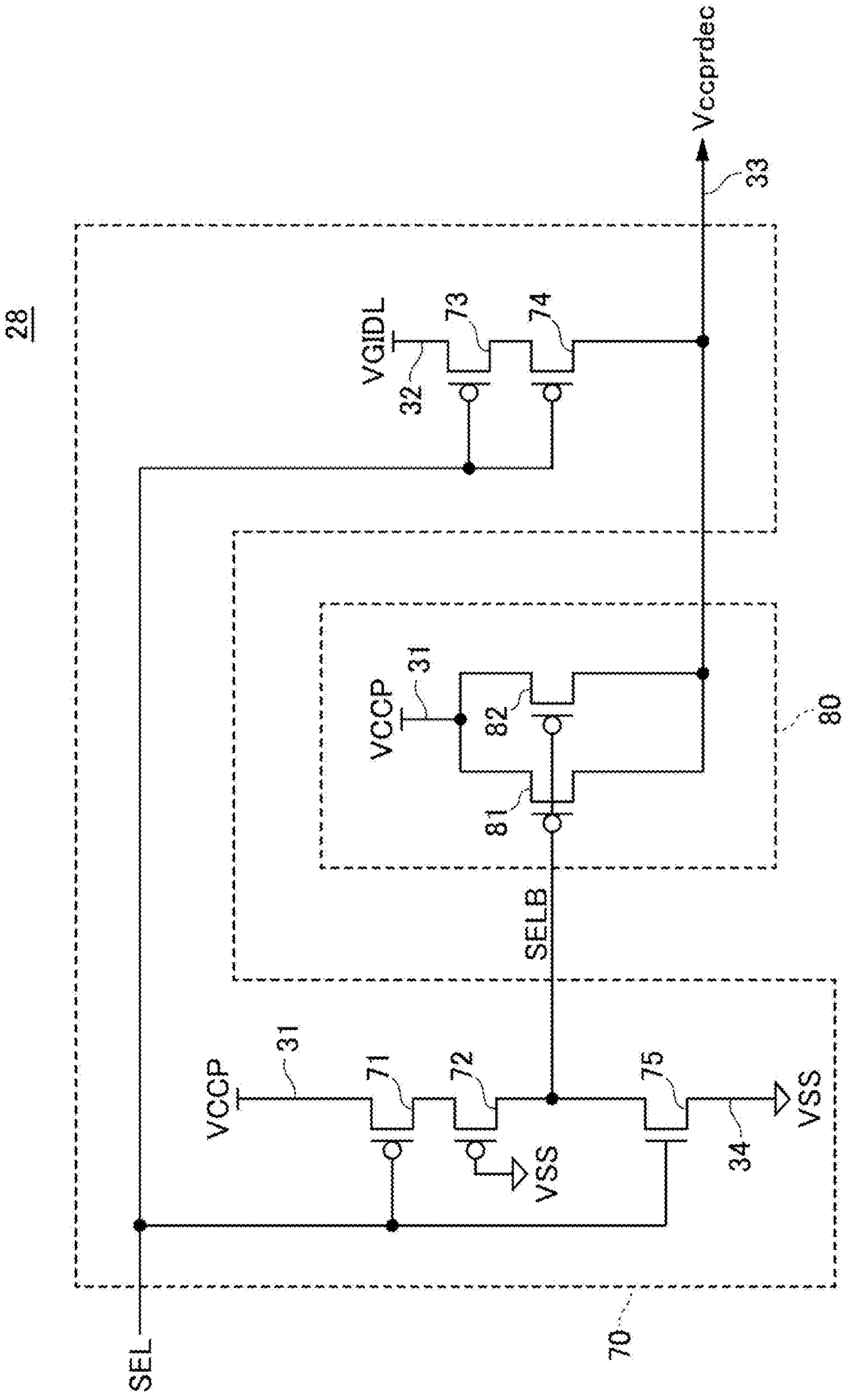
FIG. 6 is a circuit diagram of a voltage control circuit.

FIG. 6 is a circuit diagram of the voltage control circuit 28. As shown in FIG. 6, the voltage control circuit 28 includes a control circuit 70 and a driver circuit 80. The control circuit 70 includes P-channel MOS transistors 71 to 74 and an N-channel MOS transistor 75. The transistors 71, 72, and 75 are coupled to one another in series between the power line 31 to which the power potential VCCP is supplied and the power line 34 to which the ground potential VSS is supplied. The selection signal SEL is supplied to a gate electrode of each of the transistors 71 and 75. The ground potential VSS is supplied to a gate electrode of the transistor 72 in a fixed manner. With this configuration, the transistors 71, 72, and 75 constitute an inverter circuit, and a signal SELB obtained by inverting the selection signal SEL is output from a coupling point between the transistor 72 and the transistor 75. The transistors 73 and 74 are coupled to each other in series between the power line 32 to which the power potential VGIDL is supplied and the power line 33 to which the power potential Vccprdec is supplied. The selection signal SEL is supplied to a gate electrode of each of the transistors 73 and 74. The driver circuit 80 includes P-channel MOS transistors 81 and 82. The transistors 81 and 82 are coupled to each other in parallel between the power line 31 to which the power potential VCCP is supplied and the power line 33 to which the power potential Vccprdec is supplied. The signal SELB is supplied to a gate electrode of each of the transistors 81 and 82. With this circuit configuration, when the selection signal SEL is at a high level, the transistors 81 and 82 are turned on, and the power potential VCCP is supplied to the power line 33. In this case, the power potential Vccprdec is at the same level as the power potential VCCP. Meanwhile, when the selection signal SEL is at a low level, the transistors 73 and 74 are turned on, and the power potential VGIDL is supplied to the power line 33. In this case, the power potential Vccprdec is at the same level as the power potential VGIDL.

Here, the transistor 72 that is always turned on is coupled in series with the transistor 71 so as to maintain a certain withstand voltage during a period where the transistors 71 and 72 are turned on, while using transistors 71 and 72 each having the same gate length and the same array pitch as those of a P-channel MOS transistor used for the main word driver circuit 27 and the gate lengths of these transistors are virtually enlarged to be twice by coupling these transistors in series. Further, the transistors 73 and 74 are coupled to each other in series so as to reduce an on-current during a period where the transistors 73 and 74 are turned on, while using transistors 73 and 74 each having the same gate length and the same array pitch as those of a P-channel MOS transistor used for the main word driver circuit 27 and the gate lengths of these transistors are virtually enlarged to be twice by coupling these transistors in series.

Figure 7:
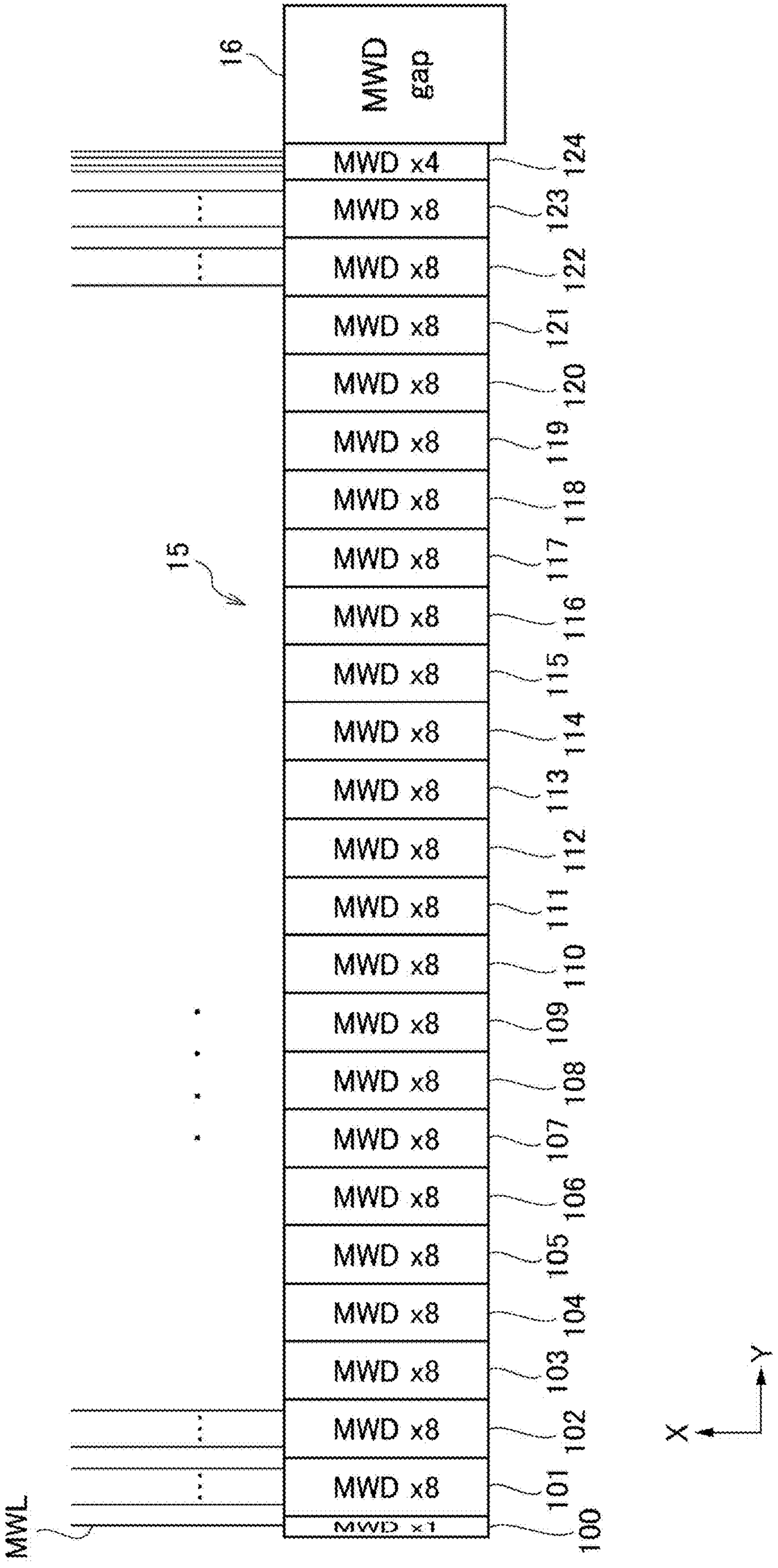
FIG. 7 is a schematic plan view for explaining an example of a configuration of the main word driver region.

FIG. 7 is a schematic plan view for explaining an example of a configuration of the main word driver region 15. In the example shown in FIG. 7, the main word driver region 15 is divided into 25 unit driver regions 100 to 124 arrayed in the Y direction. Any one of the level shift circuits 26<0> to 26<24> shown in FIG. 4 is respectively arranged in each of the 25 unit driver regions 100 to 124. Therefore, each of the unit driver regions 100 to 124 is selected by each of associated pre-decode bits RF610<0> to RF610<24>. In the example shown in FIG. 7, eight main word driver circuits 27<*i*>_0 to 27<*i*>_7 shown in FIG. 5 are arranged in each of 23 unit driver regions 101 to 123. One main word driver circuit 27 is arranged in the unit driver region 100 positioned at one end of the main word driver region 15 in the Y direction. Four main word driver circuits 27 are arranged in the unit driver region 124 positioned at the other end of the main word driver region 15 in the Y direction. With this configuration, a total of 189 main word driver circuits 27 are arranged in one main word driver region 15. An associated main word line MWL is respectively allocated to each of the 189 main word driver circuits 27. These main word lines MWL are extended in the X direction and arrayed in the Y direction.

Figure 8:
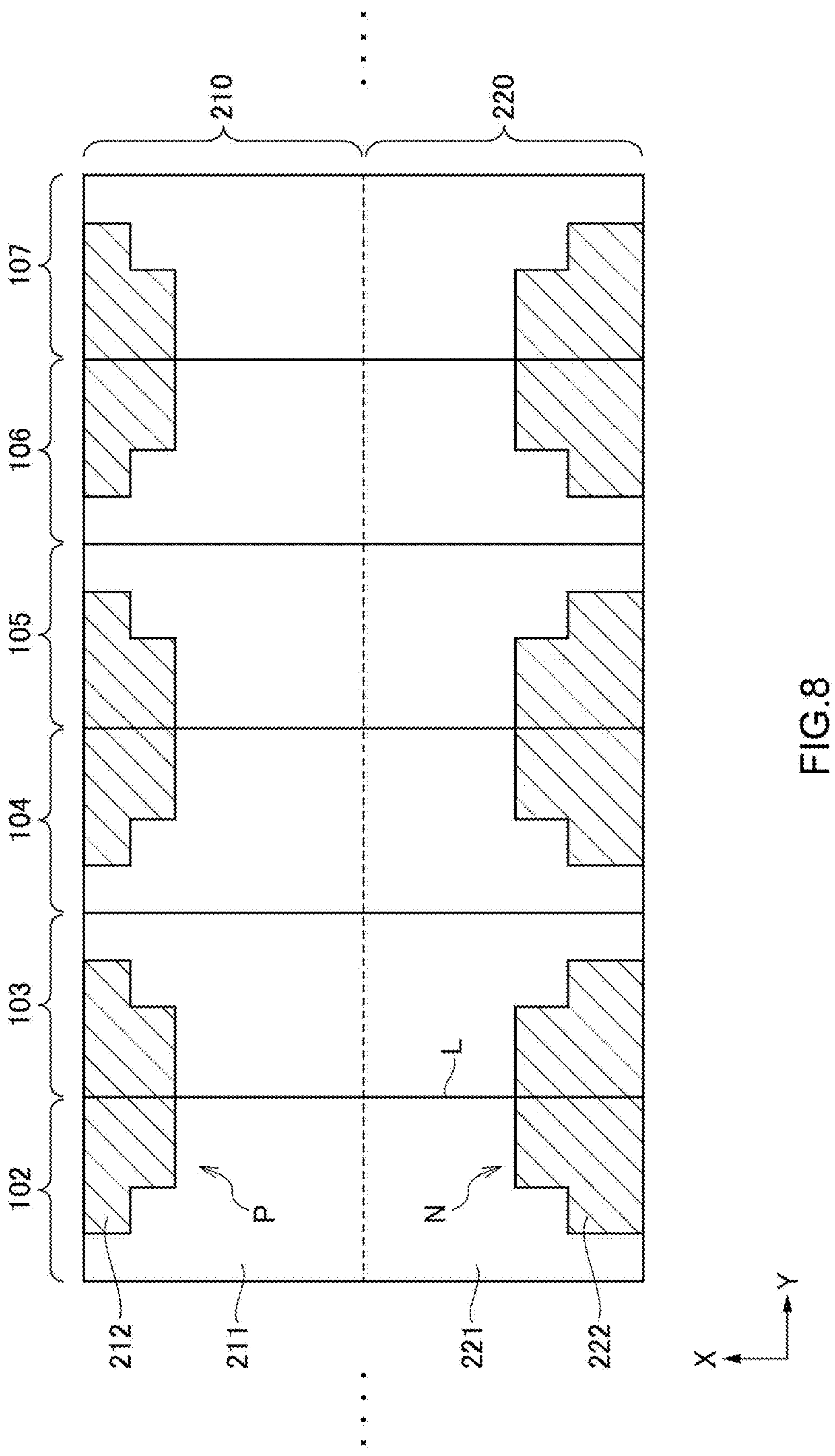
FIG. 8 is a schematic plan view for explaining a configuration of a unit driver region.

FIG. 8 is a schematic plan view for explaining a configuration of a unit driver region. While six unit driver regions 102 to 107 are shown in FIG. 8 as an example, other ones among the unit driver regions 101 to 123 including eight main word driver circuits 27 also have the same configuration. As shown in FIG. 8, the unit driver regions 102 to 107 are shaped in a rectangle. The regions on one side of the unit driver regions 102 to 107 in the X direction form a P-type region 210 in which P-channel MOS transistors are arranged. The regions on the other side of the unit driver regions 102 to 107 in the X direction form an N-type region 220 in which N-channel MOS transistors are arranged. The P-type region 210 includes a main region 211 in which P-channel MOS transistors constituting eight main word driver circuits 27 are arranged and a sub region 212 in which any main word driver circuit 27 is not arranged. The sub region 212 is positioned at one end of the P-type region 210 in the X direction and the position thereof in the Y direction is offset. Similarly, the N-type region 220 includes a main region 221 in which N-channel MOS transistors constituting eight main word driver circuits 27 are arranged and a sub region 222 in which any main word driver circuit 27 is not arranged. The sub region 222 is positioned at the other end of the N-type region 220 in the X direction and the position thereof in the Y direction is offset.

Here, unit driver regions adjacent to each other in the Y direction are axisymmetric to each other with respect to the boundary of these driver regions as an axis such that sub regions 212 are integrated with each other and sub regions 222 are also integrated with each other. For example, the driver region 102 and the driver region 103 are axisymmetric to each other with respect to a boundary line L as an axis. With this configuration, the sub region 212 included in the driver region 102 and the sub region 212 included in the driver region 103 are integrated with each other, thereby forming a combined region P in which P-channel MOS transistors can be arranged. Similarly, the sub region 222 included in the driver region 102 and the sub region 222 included in the driver region 103 are integrated with each other, thereby forming a combined region N in which N-channel MOS transistors can be arranged. With this configuration, a pair of combined regions P and N is formed in each 16 main word driver circuits 27.

Figure 9:
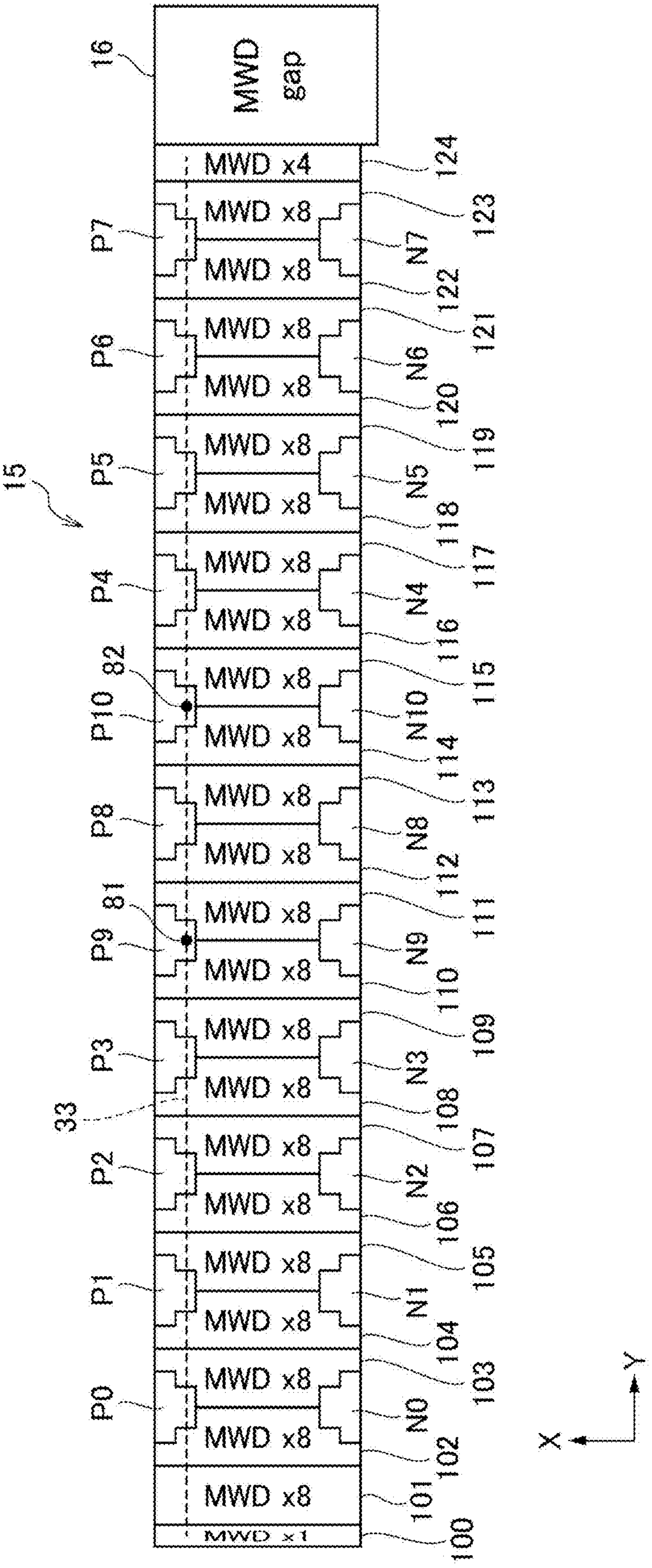
FIG. 9 is a schematic plan view for explaining circuits arranged in combined regions in the layout shown in FIG. 7.

FIG. 9 is a schematic plan view for explaining circuits arranged in the combined regions P and N in the layout shown in FIG. 7. In the example shown in FIG. 9, 11 combined regions P0 to P10 and 11 combined regions N0 to N10 are formed in one main word driver region 15. Among these combined regions, eight combined regions P0 to P7 and eight combined regions N0 to N7 respectively have eight level shift circuits 25 shown in FIG. 3 arranged therein. For example, P-channel MOS transistors constituting the level shift circuit 25<0> are arranged in the combined region P0 and N-channel MOS transistors constituting the level shift circuit 25<0> are arranged in the combined region N0. Here, the combined regions P0 to P3 and the combined regions N0 to N3 are positioned in the unit driver regions 102 to 109, and the combined regions P4 to P7 and the combined regions N4 to N7 are positioned in the unit driver regions 116 to 123.

Meanwhile, the P-channel MOS transistors 71 to 74 among the transistors constituting the control circuit 70 included in the voltage control circuit 28 are arranged in the combined region P8 positioned in the unit driver regions 112 and 113. Further, the N-channel MOS transistor 75 among the transistors constituting the control circuit 70 included in the voltage control circuit 28 is arranged in the combined region N8 positioned in the unit driver regions 112 and 113. Furthermore, the P-channel MOS transistor 81 constituting the driver circuit 80 included in the voltage control circuit 28 is arranged in the combined region P9 positioned in the unit driver regions 110 and 111. The P-channel MOS transistor 82 constituting the driver circuit 80 included in the voltage control circuit 28 is arranged in the combined region P10 positioned in the unit driver regions 114 and 115.

With this configuration, it is not necessary to arrange the voltage control circuit 28 in the gap region 16, so that the gap region 16 in the X direction can be downsized. Further, since the combined regions P9 and P10 in which the driver circuit 80 is arranged are positioned in a portion close to the center of the main word driver region 15 in the Y direction, as compared to a case where the driver circuit 80 is arranged in the gap region 16, the wiring length of the power line 33 coupling the driver circuit 80, the level shift circuits 25 and 26, and the main word driver circuit 27 to one another is shortened. FIG. 9 shows a state where the power line 33 and the transistors 81 and 82 constituting the driver circuit 80 are coupled to one another in the combined regions P9 and P10. With this configuration, the interconnection resistance on the power line 33 supplying the power potential Vccprdec can be reduced.

Figure 10:
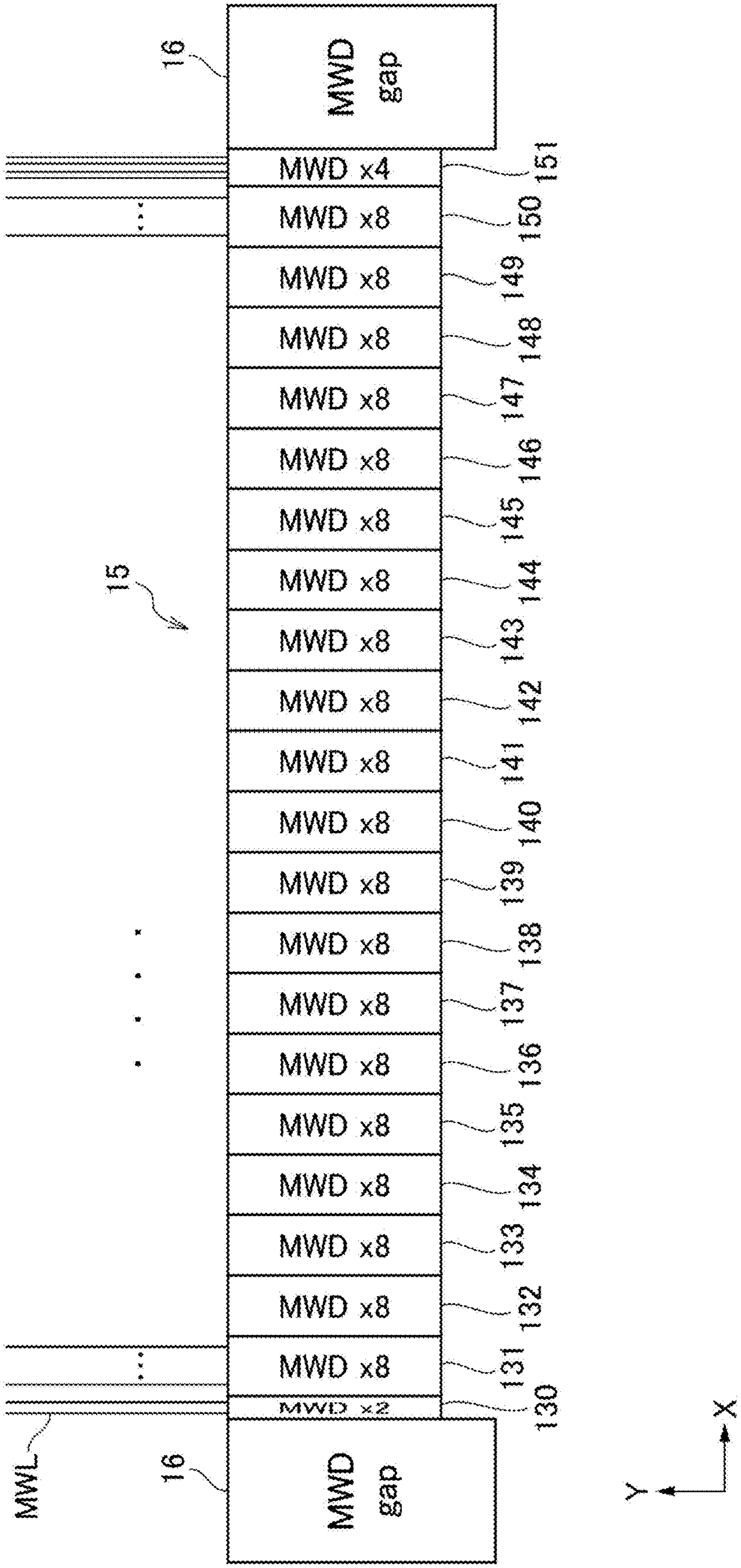
FIG. 10 is a schematic plan view for explaining another example of the configuration of the main word driver region.

FIG. 10 is a schematic plan view for explaining another example of the configuration of the main word driver region 15. In the example shown in FIG. 10, the main word driver region 15 is divided into 22 unit driver regions 130 to 151 arrayed in the Y direction. Among the unit driver regions 130 to 151, 20 unit driver regions 131 to 150 respectively have eight main word driver circuits 27 arranged therein, the unit driver region 130 positioned at one end of the main word driver region 15 in the Y direction has two main word driver circuits 27 arranged therein, and the unit driver region 151 positioned at the other end of the main word driver region 15 in the Y direction has four main word driver circuits 27 arranged therein. With this configuration, a total of 166 main word driver circuits 27 are arranged in one main word driver region 15.

Figure 11:
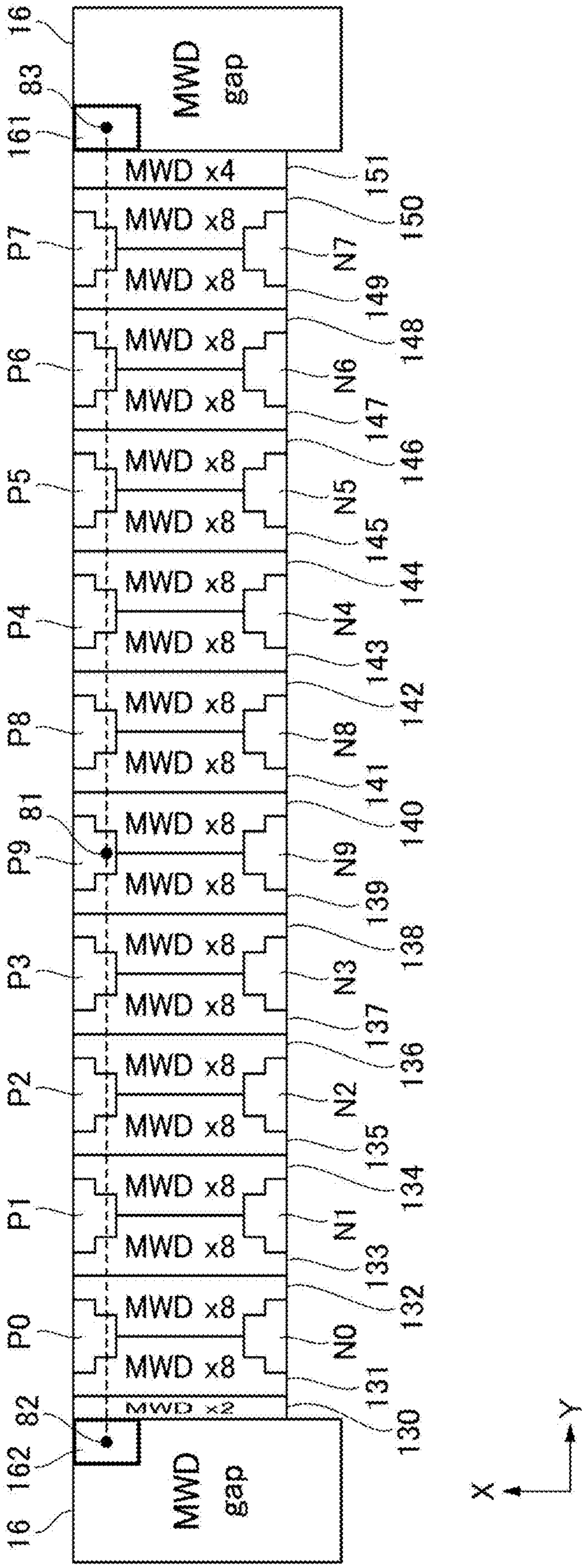
FIG. 11 is a schematic plan view for explaining circuits arranged in combined regions in the layout shown in FIG. 10.

FIG. 11 is a schematic plan view for explaining circuits arranged in the combined regions P and N in the layout shown in FIG. 10. In the example shown in FIG. 11, ten combined regions P0 to P9 and ten combined regions N0 to N9 are formed in one main word driver region 15. Among the combined regions P0 to P9 and N0 to N9, eight combined regions P0 to P7 and eight combined regions N0 to N7 respectively have eight level shift circuits 25 shown in FIG. 8 arranged therein. Here, the combined regions P0 to P3 and the combined regions N0 to N3 are positioned in the unit driver regions 131 to 138 and the combined regions P4 to P7 and the combined regions N4 to N7 are positioned in the unit driver regions 143 to 150.

Figure 12:
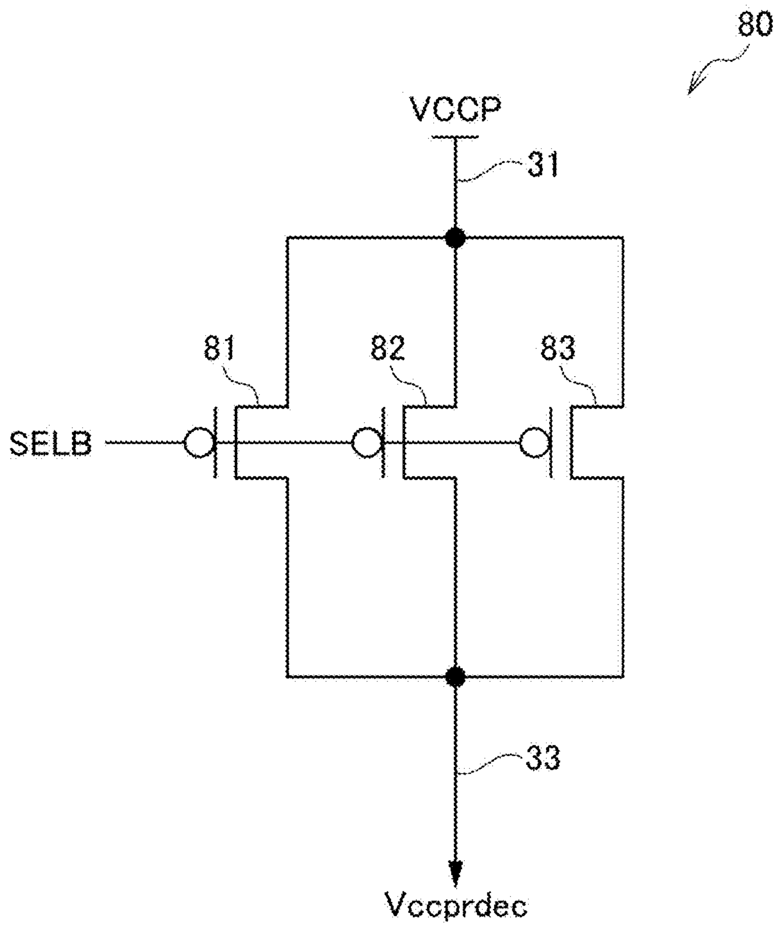
FIG. 12 is a circuit diagram of a driver circuit according to a modification.

Meanwhile, the P-channel MOS transistors 71 to 74 among the transistors constituting the control circuit 70 included in the voltage control circuit 28 are arranged in the combined region P8 positioned in the unit driver regions 141 and 142. Further, the N-channel MOS transistor 75 among the transistors constituting the control circuit 70 included in the voltage control circuit 28 is arranged in the combined region N8 positioned in the unit driver regions 141 and 142. Furthermore, the P-channel MOS transistor 81 constituting the driver circuit 80 included in the voltage control circuit 28 is arranged in the combined region P9 positioned in the unit driver regions 139 and 140. In this example, three P-channel MOS transistors 81 to 83 coupled in parallel to the driver circuit 80 are included as shown in FIG. 12. Further, as shown in FIG. 11, the transistor 82 is arranged in the gap region 16 adjacent to one side of the main word driver region 15 in the Y direction and the transistor 83 is arranged in the gap region 16 adjacent to the other side of the main word driver region 15 in the Y direction.

With this configuration, since the transistors 81 to 83 constituting the driver circuit 80 are arranged in the Y direction in a distributed manner, the wiring length of the power line 33 coupling the driver circuit 80, the level shift circuits 25 and 26, and the main word driver circuit 27 to one another is further shortened. FIG. 11 shows a state where the power line 33 and the transistors 81 to 83 constituting the driver circuit 80 are coupled to one another in the combined region P9 and two gap regions 16. With this configuration, the interconnection resistance on the power line 33 supplying the power potential Vccprdec can be further reduced.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

a plurality of first regions arranged in a first direction, each of the plurality of first regions including a second region and a third region;

a plurality of main word lines extending in a second direction crossing the first direction and arranged in the first direction;

a plurality of main word driver circuits each configured to activate an associated one of the plurality of main word lines responsive to a row address signal; and a voltage control circuit configured to supply a first power voltage to the plurality of main word driver circuits in a first operation mode and a second power voltage different from the first power voltage to the plurality of main word driver circuits in a second operation mode, wherein one or ones of the plurality of main word driver circuits is arranged in the second region included in each of the plurality of first regions, wherein the voltage control circuit is divided into multiple circuit portions which are arranged in two or more third regions in two or more of the plurality of first regions, respectively, wherein each of the plurality of first regions comprises:

a first sub region comprising a first portion of the third region; and a second sub region comprising a second portion of the third region, wherein the first portion of the third region and the second portion of the third region are separated by the second region, and wherein in two adjacent first regions, the first portions of the third region are integrated with each other to form a combined region.

2. The apparatus of claim 1, wherein the voltage control circuit includes:

a first switch circuit coupled between a first power line supplied with the first power voltage and a third power line supplying an operation voltage to the plurality of main word driver circuits;

a second switch circuit coupled between a second power line supplied with the second power voltage and the third power line; and a control circuit configured to control the first and second switch circuits, wherein the first switch circuit is arranged in the third region included in a first one of the plurality of first regions, and wherein the control circuit is arranged in the third region included in a second one of the plurality of first regions.

3. The apparatus of claim 2, wherein the second switch circuit is arranged in the third region included in the second one of the plurality of first regions.

4. The apparatus of claim 3, wherein the voltage control circuit further includes a third switch circuit coupled in parallel with the first switch circuit, and wherein the third switch circuit is arranged in the third region included in a third one of the plurality of first regions.

5. The apparatus of claim 4, wherein the second one of the plurality of first regions is arranged between the first one of the plurality of first regions and the third one of the plurality of first regions in the first direction.

6. The apparatus of claim 2, further comprising:

a first decoder circuit configured to decode a first part of the row address signal to activate one of a plurality of first selection signals; and a first level shift circuit configured to convert a level of the plurality of first selection signals from a first amplitude to a second amplitude, wherein the first level shift circuit is arranged in the third region included in a fourth one of the plurality of first regions.

7. The apparatus of claim 6, wherein the second amplitude is substantially the same as the first power voltage.

8. The apparatus of claim 7, further comprising:

a second decoder circuit configured to decode a second part of the row address signal to activate one of a plurality of second selection signals; and a second level shift circuit configured to convert a level of the plurality of second selection signals from the first amplitude to the second amplitude, wherein the second level shift circuit is arranged in each of the plurality of first regions.

9. The apparatus of claim 8, wherein each the plurality of main word driver circuits is configured to activate an associated one of the plurality of main word lines when both an associated one of the plurality of first selection signals and an associated one of the plurality of second selection signals are activated.

10. The apparatus of claim 2, further comprising:

a memory cell array coupled to the plurality of main word lines and located so as to overlap the plurality of first regions in the second direction; and a fourth region located adjacent to the plurality of first regions in the first direction so as not to overlap the memory cell array in the second direction.

11. The apparatus of claim 10, wherein the voltage control circuit is arranged in the third region included in one or ones of the plurality of first regions without arranged in the fourth region.

12. The apparatus of claim 10, wherein the voltage control circuit further includes a third switch circuit coupled in parallel with the first switch circuit, and wherein the third switch circuit is arranged in the fourth region.

13. The apparatus of claim 12, further comprising a fifth region located so as not to overlap the memory cell array in the second direction, wherein the plurality of first regions are arranged between the fourth and fifth regions in the first direction, wherein the voltage control circuit further includes a fourth switch circuit coupled in parallel with the first and third switch circuits, and wherein the fourth switch circuit is arranged in the fifth region.

14. An apparatus comprising:

a memory cell array configured to be accessed by a plurality of main word signals;

a main word circuit configured to activate one of the plurality of main word signals and arranged in a main word circuit region overlapping with the memory cell array in a first direction a sense circuit configured to amplify a read data read from the memory cell array and arranged in a sense amplifier region overlapping with the memory cell array in a second direction perpendicular to the first direction; and a voltage control circuit configured to control an operation voltage of the main word circuit, wherein a part of the voltage control circuit is arranged in the main word circuit region so as to overlap with the memory cell array in the first direction, and wherein another part of the voltage control circuit is arranged in a gap region adjacent to the main word circuit region in the second direction and adjacent to the sense amplifier region in the first direction so as not to overlap with the memory cell array in the first direction, wherein the voltage control circuit includes:

a plurality of first power circuits configured to supply the operation voltage having a first level to the main word circuit; and a second power circuit configured to supply the operation voltage having a second level lower than the first level to the main word circuit, wherein one of the plurality of first power circuits is arranged in the main word circuit region, wherein another of the plurality of first power circuits is arranged in the gap region wherein the voltage control circuit further includes a control circuit configured to activate the first power circuit or the second power circuit, and wherein the control circuit is arranged in the main word circuit region.

15. An apparatus comprising:

a plurality of first regions arranged in line, each of the plurality of first regions including a second region in a center area, a third region along a first side and a fourth region along a second side opposed to the first sides wherein the third region of a first one of the plurality of first regions and the third region of a second one of the plurality of first regions are integrated with each other to form a combined region, wherein the first one of the plurality of first regions is adjacent to the second one of the plurality of first regions;

a plurality of main word driver circuits each arranged in a corresponding one of second regions of the plurality of first regions; and a voltage control circuit configured to supply a voltage to each of the plurality of main word driver circuits, the voltage control circuit is divided into multiple circuit portions which are arranged in one or ones of the third and fourth regions in one or ones of the plurality of first regions.

16. The apparatus of claim 15, wherein the multiple circuit portions includes:

a first switch circuit configured to supply a first voltage to each of the plurality of main word driver circuits;

a second switch circuit configured to supply a second voltage to each of the plurality of main word driver circuits; and a control circuit configured to control the first and second switch circuits, wherein the first switch circuit is arranged in one of the third regions, wherein the second switch circuit is arranged in another one of the third regions, wherein a part of the control circuit is arranged in one of the fourth regions, wherein another part of the control circuit is arranged in the another one of the third regions.

17. The apparatus of claim 16, further comprising a plurality of level shift circuits each configured to receive a first control signal having a first amplitude to generate a second control signal having a second amplitude, wherein a plurality of main word driver circuits is configured to be controlled by corresponding one of second control signals, and wherein the plurality of level shift circuits are arranged in associated one or ones of the third and fourth regions in another one or ones of the plurality of first regions.

18. An apparatus comprising:

a plurality of first regions arranged in line, each of the plurality of first regions including a second region in a center area, a third region along a first side and a fourth region along a second side opposed to the first side;

a plurality of main word driver circuits each arranged in a corresponding one of second regions of the plurality of first regions; and a voltage control circuit configured to supply a voltage to each of the plurality of main word driver circuits, the voltage control circuit is divided into multiple circuit portions which are arranged in one or ones of the third and fourth regions in one or ones of the plurality of first regions, wherein the third region is only available for a first conductivity type transistor, and wherein the fourth region is only available for a second conductivity type transistor.

* * * * *